(12) United States Patent
Tripsas et al.

(10) Patent No.: US 6,870,183 B2
(45) Date of Patent: Mar. 22, 2005

(54) STACKED ORGANIC MEMORY DEVICES AND METHODS OF OPERATING AND FABRICATING

(75) Inventors: Nicholas H. Tripsas, San Jose, CA (US); Uzodinma Okoroanyanwu, Mountain View, CA (US); Suzette K. Pangrle, Cupertino, CA (US); Michael A. VanBuskirk, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/287,612

(22) Filed: Nov. 4, 2002

(65) Prior Publication Data

US 2004/0084670 A1 May 6, 2004

(51) Int. Cl.[7] ........................... H01L 51/20; H01L 51/40
(52) U.S. Cl. ........................................ 257/40; 438/99
(58) Field of Search ............................. 257/40; 438/99

(56) References Cited

U.S. PATENT DOCUMENTS

| | | |
|---|---|---|
| 3,519,999 A | 7/1970 | Gregor |
| 5,272,359 A | 12/1993 | Nagasubramanian et al. |
| 6,055,180 A | 4/2000 | Gudesen et al. |
| 6,380,553 B2 * | 4/2002 | Gudesen et al. ............... 257/40 |

OTHER PUBLICATIONS

International Search Report, PCT/US03/21679, mailed Feb. 18, 2004.

* cited by examiner

*Primary Examiner*—Jerome Jackson
(74) *Attorney, Agent, or Firm*—Amin & Turocy, LLP

(57) ABSTRACT

The present invention provides a multi-layer organic memory device that can operate as a non-volatile memory device having a plurality of stacked and/or parallel memory structures constructed therein. A multi-cell and multi-layer organic memory component can be formed with two or more electrodes having a selectively conductive media between the electrodes forming individual cells, while utilizing a partitioning component to enable stacking of additional memory cells on top of or in association with previously formed cells. Memory stacks can be formed by adding additional layers—respective layers separated by additional partitioning components, wherein multiple stacks can be formed in parallel to provide a high-density memory device.

31 Claims, 12 Drawing Sheets

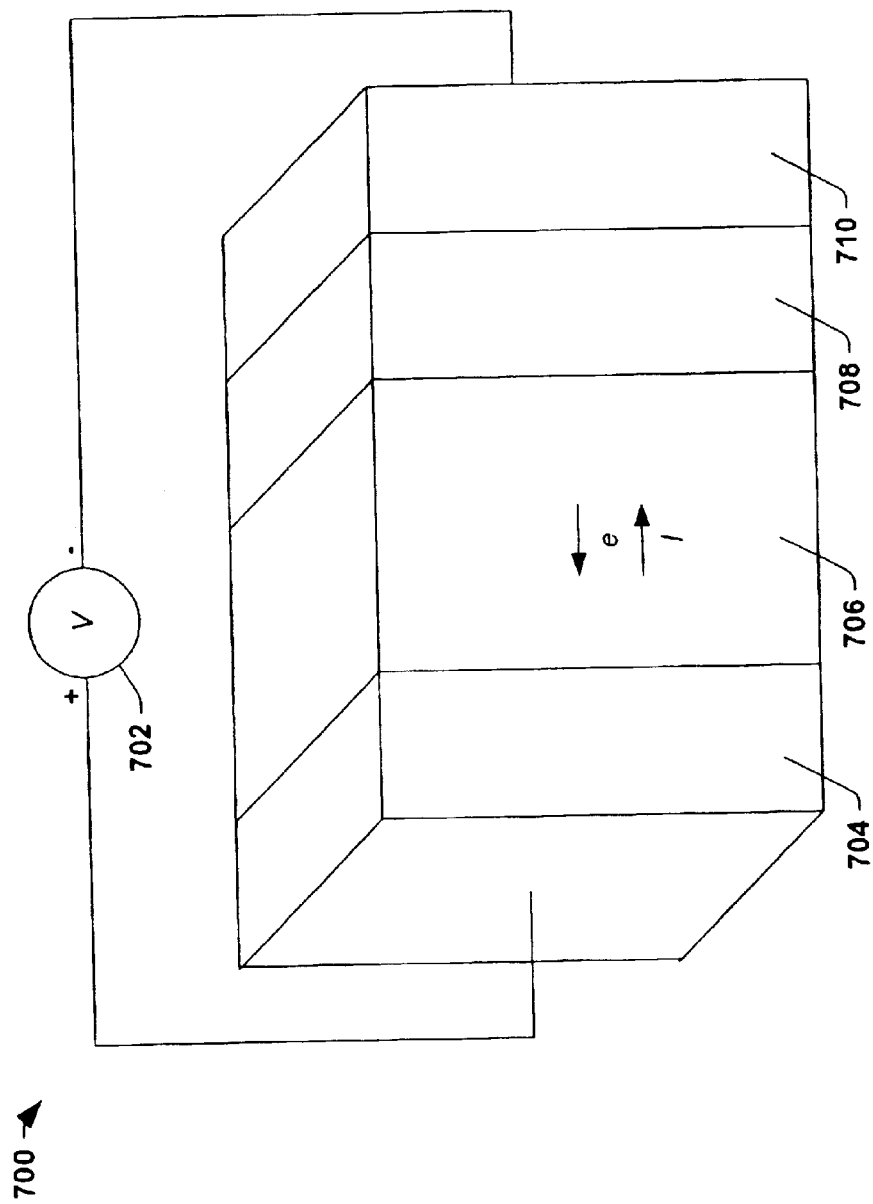

STACKED ORGANIC MEMORY DEVICES AND METHODS OF OPERATING AND FABRICATING

FIELD OF INVENTION

The present invention relates generally to organic memory devices and, in particular, to multi-layer organic memory devices containing an organic semiconductor.

BACKGROUND OF THE INVENTION

The volume, use and complexity of computers and electronic devices are continually increasing. Computers consistently become more powerful, new and improved electronic devices are continually developed (e g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Memory devices generally include arrays of memory cells. Each memory cell can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase storage capacity for memory devices (e.g., increase storage per die or chip). A postage stamp-sized piece of silicon may contain tens of millions of transistors, each transistor as small as a few hundred nanonmeters. However, silicon-based devices are approaching their fundamental physical size limits. Inorganic solid-state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as the size of inorganic solid-state devices decreases and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid-state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely. Furthermore, applying a voltage across a semiconductor junction (in the reverse-bias direction) creates a depletion region around the junction. The width of the depletion region depends-on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge. Thus, further device shrinking and density increasing may be limited for inorganic memory devices. Furthermore, such device shrinkage for inorganic non-volatile memory devices while meeting increased performance demands is particularly difficult, especially while maintaining low costs.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates to systems and methods for fabricating multi-layer organic semiconductor memory devices. Multi-level organic memory structures are provided that can store information within organic material associated with the structures. Such memory structures include top and bottom electrodes, the organic material and a passive layer associated with one of the electrodes. The organic memory structures can be formed in a vertical arrangement, wherein a partitioning component is formed or constructed between two or more organic memory structures to facilitate stacking of a plurality of similarly configured memory structures or cells. In addition, a plurality of vertically arranged stacks can be formed in parallel thus facilitating construction of highi-density memory devices, having multiple layers of vertically arranged memory cells, and providing high-speed parallel access to the respective cells. In this manner, memory device utilization, density, and packing can be substantially improved.

The partitioning components can include such devices as thin film diodes or thin film transistors, for example, that form a voltage/current-controlled isolation barrier between respective layers of stacked memory structures, devices or cells. The memory cells are activated by appling threshold voltages to the partitioning component (e.g., forward diode voltage, reverse zener breakdown voltage), and applying voltages to underlying passive and conductive layers within the stacked memory structure, wherein bits can be stored in the form of a 0, 1 or other impedance state within the selected portions or the memory structure.

The memory structures and associated memory cells can be employed to provide multi-cell and multi-layer organic memory devices that utilize an organic conductor that facilitates migration of charge (e.g., electrons, holes). The present invention provides organic memory devices that possess at least one or more of the following: small size compared to inorganic memory devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 10 is a 3-D diagram of an organic memory device in accordance with an aspect of the present invention.

DETAILED DESCRIPTION OF THE INVENTION

The present invention provides a multi-layer organic memory device that can operate as a non-volatile memory device having a plurality of stacked and/or parallel memory structures constructed therein. A multi-cell and multi-layer organic memory component can be formed with two or more electrodes having a selectively conductive media between the electrodes forming individual cells, while utilizing a partitioning component to enable stacking of additional memory cells on top of or in association with previously formed cells. Memory stacks can be formed by forming additional layers—respective layers separated by additional partitioning components, wherein multiple stacks can be formed in parallel to provide a high-density memory device. The selectively conductive media is formed in various portions of the memory structures which contains an organic conductor layer and one or more passive layers. The selectively conductive media is programmed (e.g., written) by applying bias voltages that programs a desired impedance state into the memory cell. The desired impedance state represents one or more bits of information and does not require a constant power supply or refresh cycles to maintain the desired impedance state. The impedance state of the selectively conductive media is read by applying a current and then reading the impedance of the selectively conductive media. As with the written impedance state, the read impedance state represents one or more bits of information. Additionally, methods of fabricating the organic memory devices/cells, methods of using the organic memory devices/cells, and devices such as computers containing the organic memory devices/cells are also provided.

Figure 1:
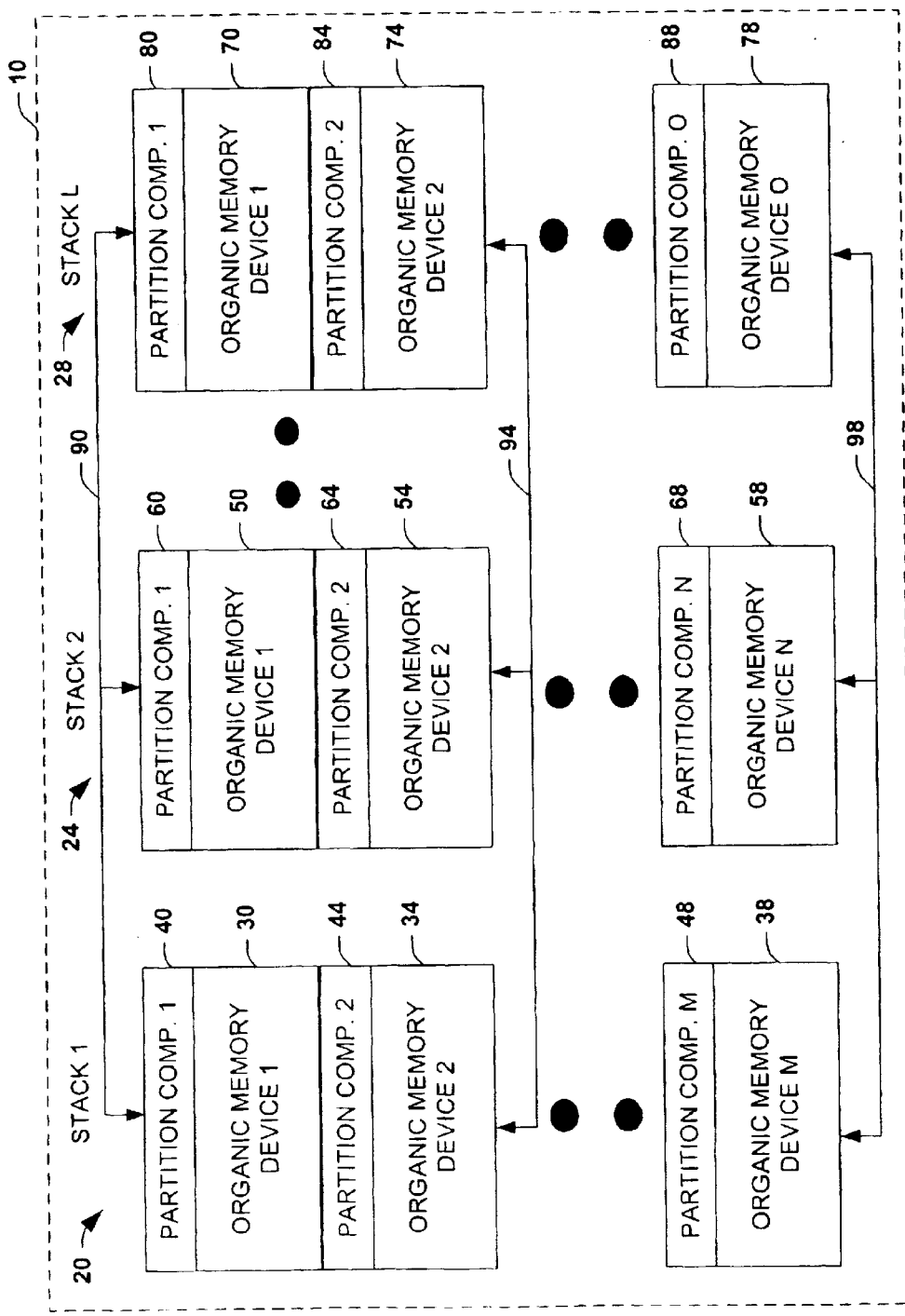
FIG. 1 is a schematic block diagram illustrating multiple memory layer and memory cell storage and access in accordance with an aspect of the present invention.

Referring initially to FIG. 1, a high-density organic memory device 10 is illustrated in accordance with an aspect of the present invention. The high-density organic memory device 10, which is also referred to as the memory device 10, includes 1 to L stacks or vertically arranged memory structures 20 through 28, L being an integer. Respective stacks 20–28 include two or more layers of organic memory devices separated by associated partitioning components between layers. For example, stack$_1$ illustrated at reference numeral 20 includes organic memory devices 1 through M illustrated at 30–38, having associated partitioning components 1 through M illustrated at 40–48, M being an integer. Similarly, stack$_2$ illustrated at reference numeral 24 includes organic memory devices 1 through N illustrated at 50–58, having associated partitioning components 1 through N illustrated at 60–68, whereas stack$_L$ illustrated at reference numeral 28 includes organic memory devices 1 through O illustrated at 70–78, having associated partitioning components 1 through O at 80–88, N and O being integers, respectively. One or more global access lines 90–98 are provided to program and/or read information from portions of one or more stacks 20–28, wherein the global access lines generally provide parallel memory programming and read operations to the stacks. As an example, such access lines 90–98 could provide a word memory access (e.g. 16 bits from adjacent stacks) or other amount of parallel memory cell access to adjacent (or non-adjacent) stacks 20–28.

To illustrate memory device 10 operations, discussion is now directed to stack$_1$ at reference 20. Generally, to program the organic memory device at 30 for example, a positive to negative programring voltage is placed between electrodes of the device (electrodes described and illustrated below), whereas the programming voltages are then reversed with respect to the electrodes to undo or reverse the programmed information which is stored in an organic material within the organic memory device and is also described below. Thus, the partitioning component 40 while providing isolation to/between a subsequent layer also reacts to the various voltages (assuming sufficient threshold voltage supplied) during programming and/or access to the organic memory device 30. As one example, a thin-film diode (TFD) can be employed as the partitioning component 40–48 rhe diode, or other controllable device such as a zener, LED, transistor, thin-filmed transistor (TFT), SCR, UJT, FET and so forth facilitate programming and/or access in one direction by being biased in a forward direction. In a reverse direction, bias voltages can be applied such that the diode breaks down such as in a zener condition to facilitate programming/access to the organic memory device in the opposite direction. As can be appreciated, respective partitioning components can be formed in accordance with various materials and/or processes, wherein various threshold voltages can be utilized to cause the partitioning components to conduct in the forward and reverse directions (e.g., 0.7v forward threshold, −3.2v reverse threshold, suitable voltage applied to control element of a three-terminal switching device).

Figure 2:
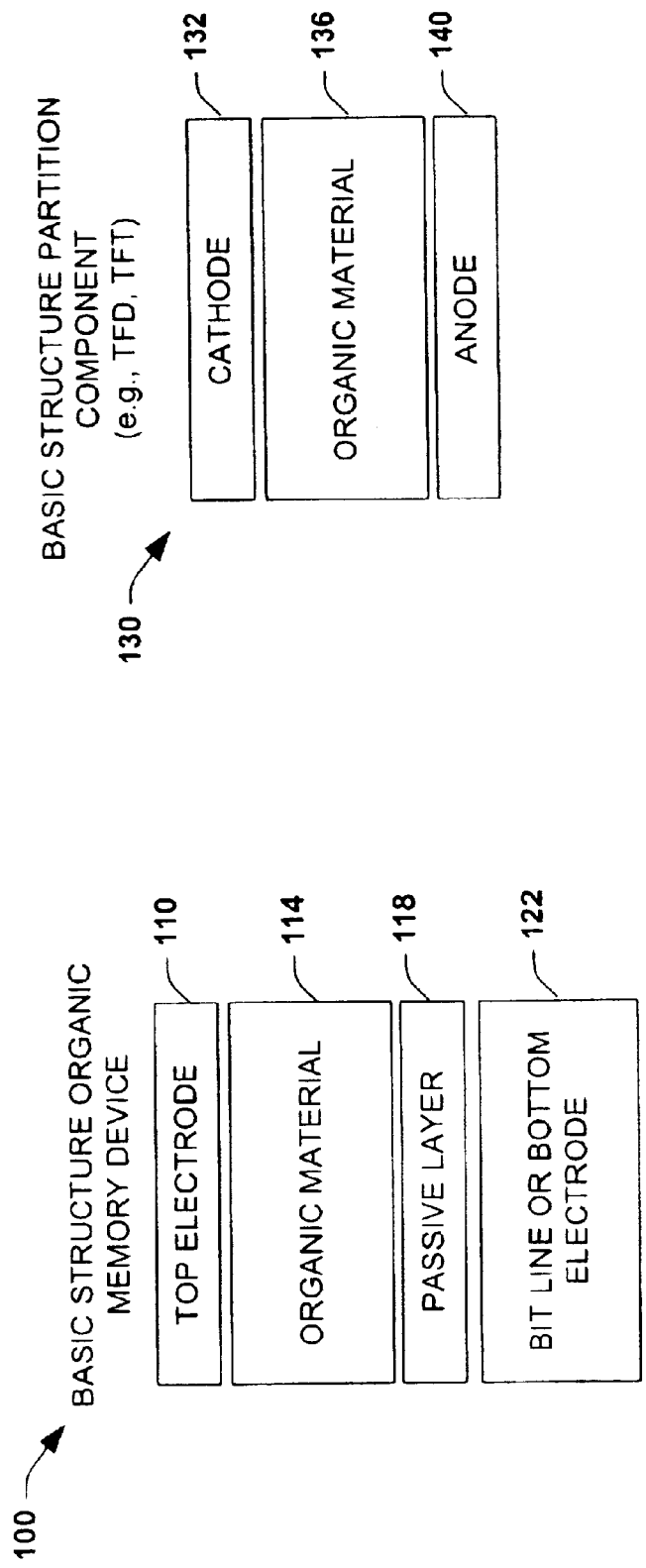
FIG. 2 is a diagram illustrating basic organic memory and partitioning component layers in accordance with an aspect of the present invention.

Referring now to FIG. 2, basic organic memory structures and organic partitioning component structures depicted in FIG. 1 are illustrated in accordance with an aspect of the present invention. An organic memory cell 100 is typically composed of several layered portions. Such portions include a top electrode 110, an organic material 114 for storing information, a passive layer 118 to facilitate access to the organic material 114, and a bottom electrode or bit line 122 that operates in accordance with the top electrode to program, erase, and/or access the organic material 114. The organic memory cell 100 which can be constructed from various materials is described in more detail below.

As noted above, various memory cells 100 can be stacked in accordance with the present invention to facilitate high-density memory structures, wherein various stacks can be similarly constructed in parallel within a memory device or integrated circuit (IC). To facilitate such stacking, a thin film diode (TFD) 130, for example, can be provided as a partitioning component that separates layers and facilitates access thereto. As illustrated, the TFD 130 can also be constructed in accordance with several layered portions. These portions include a cathode electrode 132, an organic material 136 (e.g polymer film), and an anode electrode 140. Thus, applying a forward or positive bias voltage on the anode electrode 140 with respect to the cathode electrode 132 causes current to flow in a forward direction. In a reverse direction of the bias voltage, current flow is typically minimized, unless the reverse bias voltage is increased beyond the zener threshold of the TFD 136. Thus, by controlling the forward and reverse voltages applied to the TFD 130 (or control element such as in a transistor), programming and access can be provided to the associated organic memory structure 100, while in yet another regard, the TFD 130 provides isolation/separation between respective layers of organic memory structures 100 to facilitate stacking of such structures and thereby increase memory device density.

Figure 3:
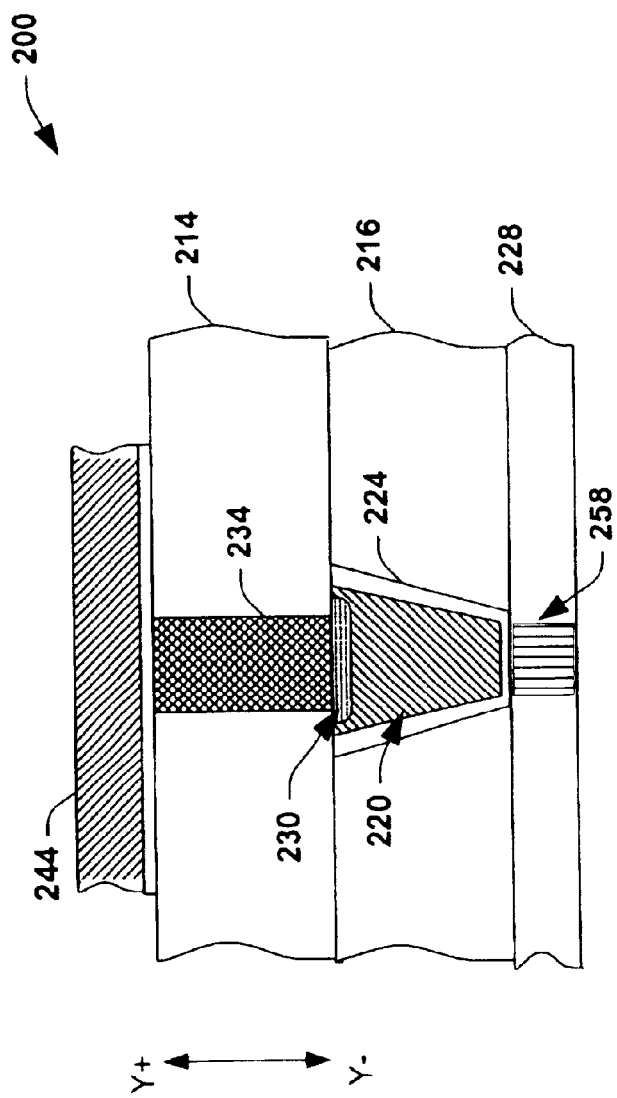
FIG. 3 is a cut-away view diagram of a portion of a layered organic memory device in accordance with an aspect of the present invention.

It is to be appreciated that although various exemplary layers are illustrated in the organic memory structure 100 and TFD 130, that other layers may be formed and/or provided in accordance with the present invention. For example, such layers can include Inter Layer Dielectrics (ILD), barrier layers, coatings, and/or combinations of layers/other elements that cooperate to form memory structures and/or partitioning components in accordance with the present invention which includes alternative layers and/or elements that are described in more detail below. As one example of layered memory concepts, FIG. 3 depicts a cut-away view of a single cell memory device 200 (also referred to as memory device 200) that can be stacked and/or arranged with other similarly adapted memory stacks (not shown) in accordance with an aspect of the present invention. The memory device 200 can include various dielectric layers such as a layer 214 and layer 216, wherein such layers are also referred to as an Inter Layer Dielectric (ILD). Such layers 214 and 216 can be semiconductor material, for example, and/or substantially any type material having dielectric properties. Within layer 216, a lower electrode 220 is formed having an associated barrier layer 224 that mitigates diffusion of the lower electrode 220 into a subsequent layer 228. Above the lower electrode 220, a passive layer 230 is formed. The lower electrode 220 and associated passive layer (or layers) 230 cooperate as a common activation or access element for the memory device 200 described herein.

After the passive layer 230 has been added, the dielectric layer 214 is added above the layer 216, wherein organic semiconductor material 234 (e.g., polymer) is then formed within the layer 214. A conductive electrode 244 is formed above the organic material 234 (can also include barrier layers between top electrodes and organic material), whereby a memory cell is formed in vertical portions (Y+ and Y− directions) of the organic material 234. Thus, if a suitable voltage is applied between electrode 244 and electrode 220, a storage state (e.g., 1, 0, other impedance state) can be stored in (or read from) the memory cell formed in the organic material 234.

As noted above, a plurality of such memory devices 200 can be manufactured in accordance with an Integrated Circuit (IC) memory device (e.g., 1 Mbit, 2 Mbit, 8 Mbit storage cells, . . . and so forth, constructed as a non-volatile memory IC). In addition, common-word lines such as illustrated at 258 in layer 228 can be provided to store, erase, read, and write a plurality of multi-cell structures in accordance with the present invention (e.g., 8/16 byte/word erase, read, write). It is to be appreciated that the memory device 200 can be stacked in accordance with other adapted memory devices in a vertical arrangement or columns, whereby other stacks can also be similarly constructed which is described in more detail below. The memory device 200 illustrates a damascene via approach which is also described in more detail below with respect to FIG. 4 in order to facilitate stacking in accordance with the present invention. Alternatively, a pillared or layered approach depicted in FIG. 5 can be provided, wherein respective layers are essentially stacked or constructed from the bottom up and successively etched to form vertical memory structures or columns in accordance with the present invention. As noted above, respective partitioning components are provided to provide separation between subsequent memory devices that are stacked upon previously fonned vertical structures or columns.

Figure 4:
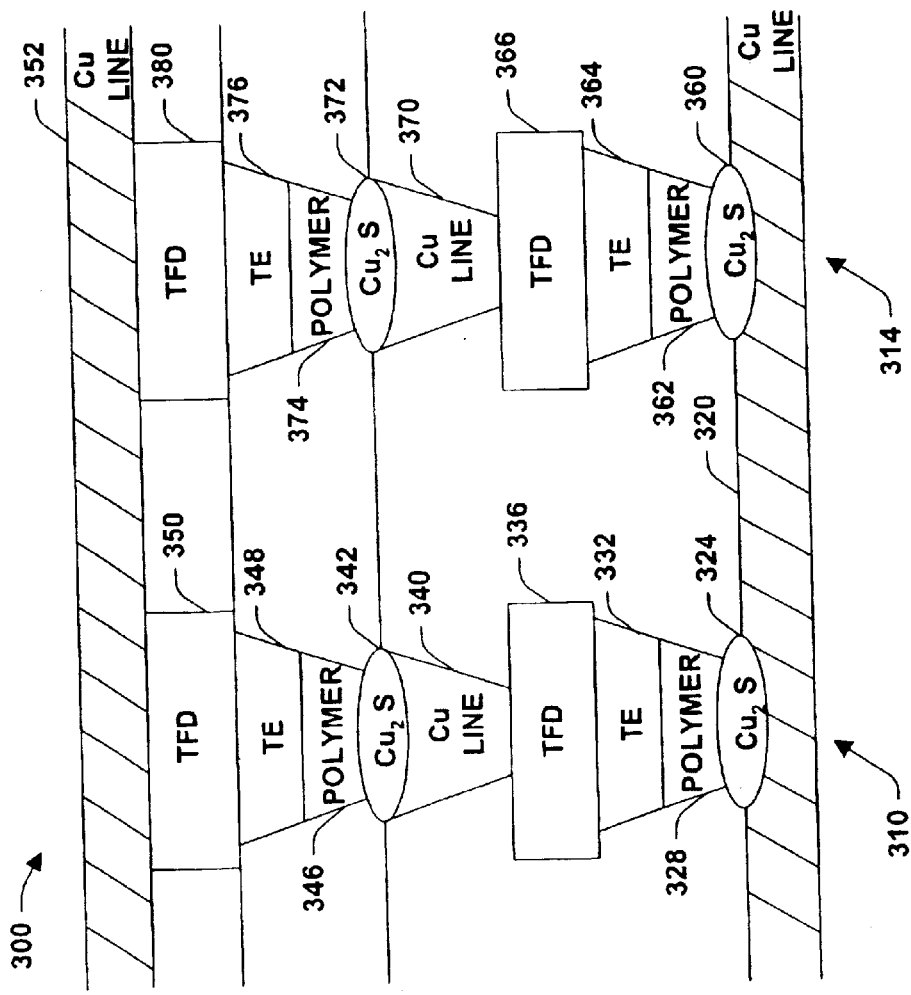
FIG. 4 is a diagram illustrating stacked memory device in accordance with an aspect of the present invention.

FIG. 4 is a diagram illustrating a stacked memory device 300 in accordance with an aspect of the present invention. The stacked memory device 300 depicts two vertical columns 310 and 314, wherein respective columns include two layers of organic memory cells. It is to be appreciated that the stacked memory device 300 is exemplary in nature in that two columns and layers are illustrated, however, a plurality of such columns and/or layers (number of layers do not need to match number of columns) can be provided as described above with respect to FIG. 1. It is further to be appreciated that alternative materials from that shown in FIG. 4 can be employed to form the stacked memory device 300 and are described in more detail below.

The stacked memory device 300 can be constructed in accordance with a damascene/via approach and is described in more detail below with respect to FIGS. 6–8.

The following discussion is related to the vertical column 310 and can be similarly applied to the vertical column 314. Vertical column 314 includes a copper line 320 (e.g., global access line) having a passive $Cu_{2-x}S_y$ (where the copper is in a non-stioichiometric oxidation state: $1.8 \leq x \leq 2.0$) layer 324 formed thereon. A polymer layer 328, a top electrode 332 are formed above the passive layer 324, wherein a thin film diode 336 (TFD) is then formed above the top electrode 332 (TFD may be several layers as discussed above) before beginning construction of a subsequent memory layer. After the TFD 336 is formed, another memory structure is constructed having a copper line 340, a passive layer 342, a polymer layer 346, and a top electrode 348, wherein a subsequent TFD 350 and copper layer 352 is then formed. The vertical column at 314 is similarly constructed from components 360–380.

Figure 5:
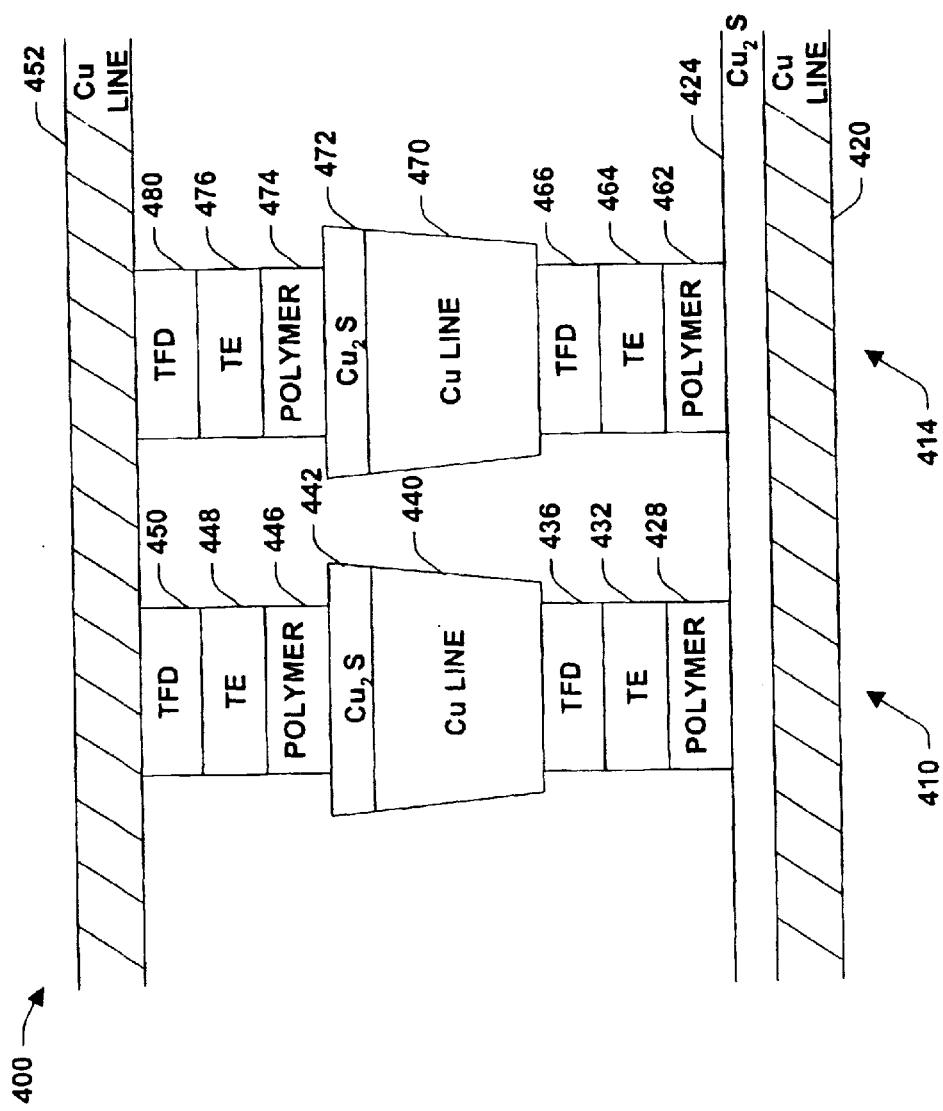
FIG. 5 illustrates an alternative stacked memory device in accordance with an aspect of the present invention.

FIG. 5 illustrates an alternative stacked memory device 400 in accordance with an aspect of the present invention. Similar to the memory device 300 above, the stacked memory device 400 depicts two vertical columns 410 and 414, wherein respective columns include two layers of organic memory cells. As noted above, it is to be appreciated that the stacked memory device 400 is also exemplary in nature in that two columns and layers are illustrated, however, a plurality of such columns and/or layers (number of layers do not need to match number of columns) can be provided as described above with respect to FIG. 1. It is also to be appreciated that alternative materials from that shown in FIG. 5 can be employed to form the stacked memory device 400 and are described in more detail below.

The stacked memory device 400 can be constructed in accordance with a pillar approach that employs constructing multiple layers then etching pillared columns from the layers and is described in more detail below with respect to FIG. 9. The following discussion is related to the vertical column 410 and can be similarly applied to the vertical column 414. Vertical column 414 includes a copper line 420 (e.g global access line) having a passive $Cu_{2-x}S_y$ layer 424 formed thereon. A polymer layer 428, a top electrode 432 are formed above the passive layer 424, wherein a thin film diode 436 (TFD) is then formed above the top electrode 432 (TFD may be several layers as discussed above) before formation of a subsequent memory layer. After the TFD 436 is formed, another memory structure is formed having a copper line 440, a passive layer 442, a polymer layer 446, and a top electrode 448, wherein a subsequent TFD 450 and copper layer 452 is then formed. The vertical column at 414 is similarly constructed from components 462–480.

It is noted that the pillared approach illustrated by the memory device 400 may include the formation of a plurality of layers (e.g., copper, passive, polymer, electrode, TFD. copper, passive, polymer electrode TFD . . . and so forth) before formation of vertical columns (e.g., columns 410 and 414) that are subsequently etched from the preceding layers. Alternatively, a subset of layers may be formed (e.g., copper, passive, polymer, electrode, TFD), wherein vertical columns are then formed in the subset, then another subset of layers are formed over the existing vertical columns, whereby other vertical columns can then be formed in the subsequent layered subset. As can be appreciated, the processes employed in accordance with the present invention can be repeated to increase memory device density.

FIGS. 6 through 9 illustrate devices and associated methodologies to facilitate multi-cell memory fabrication in accordance with the present invention. While, for purposes of simplicity of explanation, the methodologies may be shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

Figure 6:
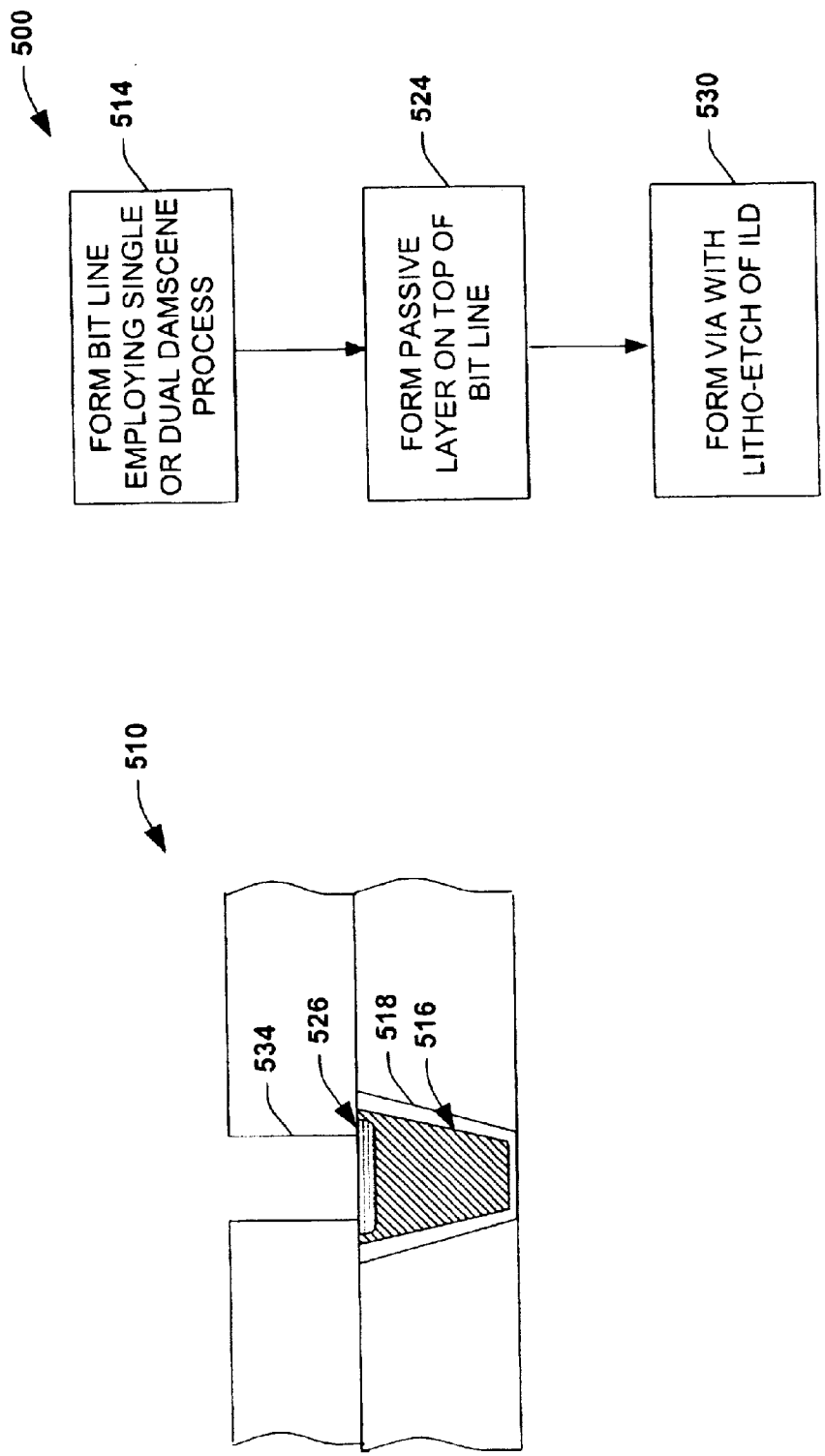
FIG. 6 is a flow diagram and associated structure illustrating a portion of a process for fabricating a multi-layer memory device in accordance with an aspect of the present invention.

Referring now to FIG. 6, a diagram 500 illustrates a portion of a process for fabricating a multi-layer memory device 510 in accordance with the.present invention. It is noted that construction of a single memory cell is described in FIGS. 6–8 for purposes of brevity, however, and as noted above, the following processes can be repeated as desired to form one or more vertical structures having a plurality of memory cells formed therein. Before proceeding with a description of the process 500 and associated structure 510, it is noted that exemplary materials and process steps will be described. However, it is to be appreciated that the present invention is not so limited. Thus, a plurality of alternative materials and/or compounds will be described in more detail below that can be employed in accordance with the present invention. Proceeding to 514, a Cu bit line or lower electrode having an associated barrier is formed in accordance with a single or dual damascene process as is well understood. The bit line is illustrated at 516 of structure 510 and the barrier is illustrated at 518 of structure 510, and are formed in an ILD layer 520. The barrier 518 is employed to mitigate copper or other conductive material from diffusing into other layers (not shown). As an example, the barrier 518 can be formed as a low K diffusion barrier. Such barrier materials that can be utilized are cobalt, chromium, nickel, palladium, tantalum, tantalum silicon nitride, titanium, titanium nitride, silicon nitride, tungsten nitride, and tungsten silicon nitride, for example.

At 524, a passive layer such as $Cu_{2-x}S_y$, for example, can be formed on the bit line 516. The passive layer is illustrated at 526 of the structure 510. At 530, a via or other type opening 534 is formed in an ILD layer 538—above the passive layer 526. The via 534 can be formed in accordance with a lithographic etch technique, for example, and/or other process for removing portions of the ILD layer 538.

Figure 7:
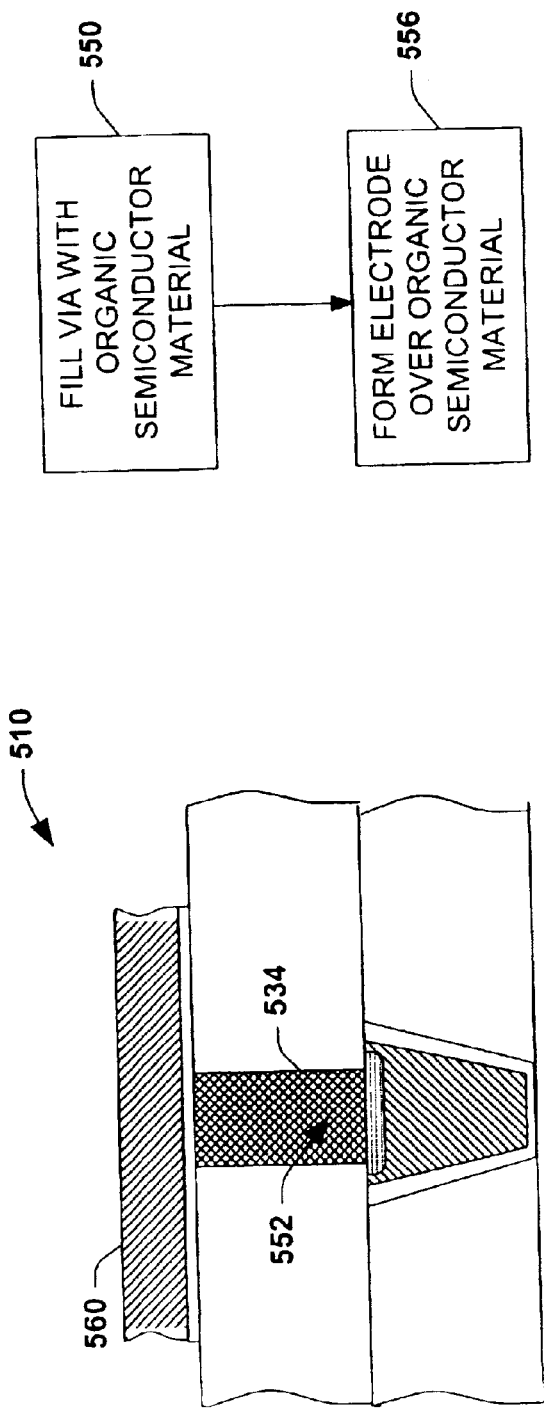
FIG. 7 is a flow diagram and associated structure illustrating a continuation of the process depicted in FIG. 6 for a multi-layer memory structure in accordance with an aspect of the present invention.

FIG. 7 illustrates a continuation of the process depicted in FIG. 6 for a multi-layer memory structure in accordance with an aspect of the present invention. Proceeding to 550, all or portions of the via 534 is filled with an organic material deposition such as a polymer although other organic materials can be employed as will be described below. The organic material or compound is illustrated at 552. At 556, an electrode 560 having an associated barrier are formed over the organic material 552 in accordance with a single or dual damascene process.

Figure 8:
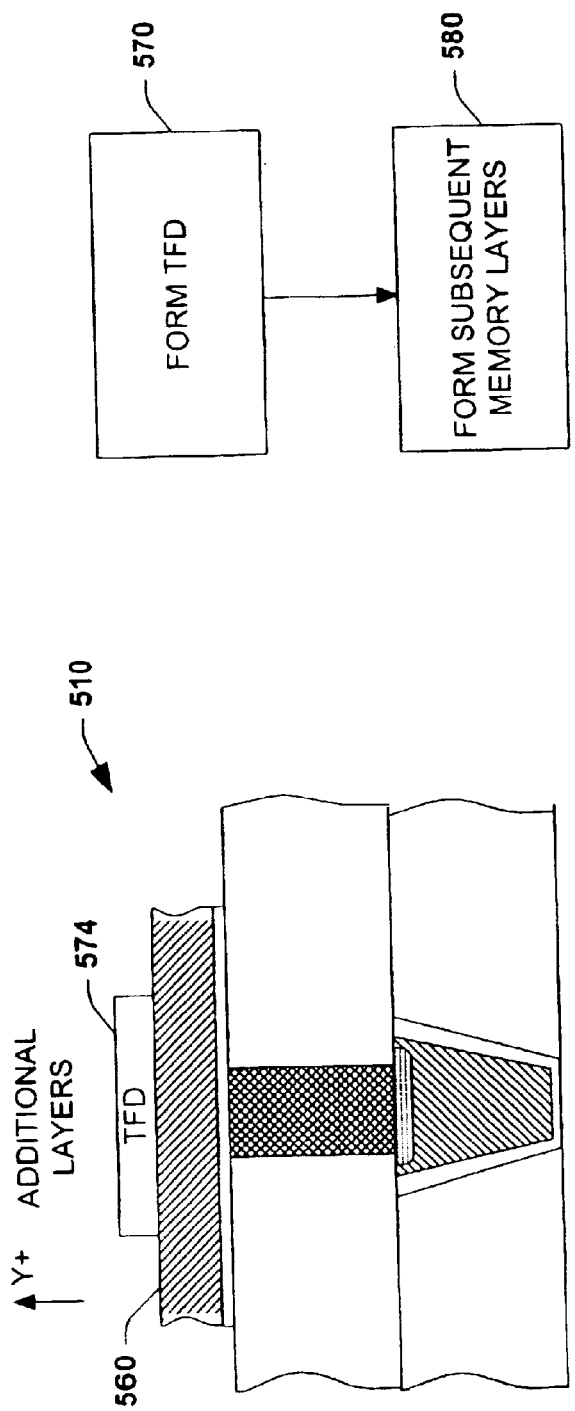
FIG. 8 is a flow diagram and associated structure illustrating a continuation of the process depicted in FIG. 7 for a multi-cell memory structure in accordance with an aspect of the present invention.

FIG. 8 illustrates a continuation of the process depicted in FIG. 7 for a multi-layer memory structure in accordance with an aspect of the present invention. Proceeding to 570, a TFD 574 is formed over the electrode 560. As noted above, the TFD 574 may also be formed of several layers including an organic semiconductor material. At 580, subsequent memory layers are formed in a vertical direction (Y+) to form a column having multiple storage locations or cells. As can be appreciated, a plurality of such columns can be formed in a concurrent manner to form a parallel memory structure, wherein respective columns are formed having multiple storage locations or cells.

Figure 9:
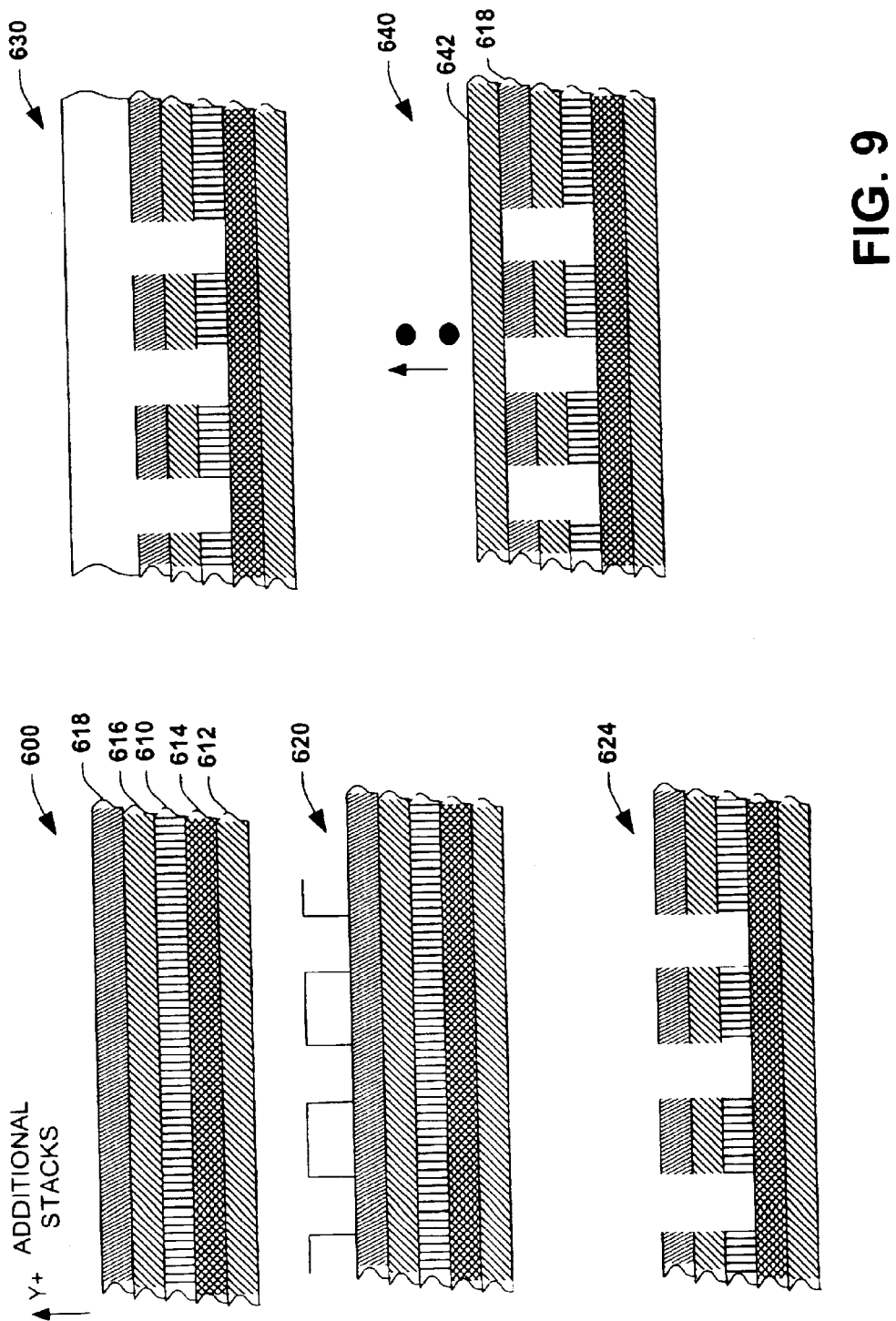
FIG. 9 illustrates a pillar approach for multi-layer memory structures in accordance with an aspect of the present invention.

FIG. 9 illustrates an alternative multi-cell memory structure 600 in accordance with an aspect of the present invention. It is noted that construction of a single layer of memory cells is described in FIG. 9 for purposes of brevity, however, and as noted above, the following processes can be repeated as desired to form one or more vertical structures having a plurality of memory cells formed therein. Before proceeding with a description of the process depicted in FIG. 9, it is noted that exemplary materials and process steps will be described. However, it is to be appreciated that the present invention is not so limited. Thus, a plurality of alternative materials and/or compounds will be described in more detail below that can be employed in accordance with the present invention.

At 600, a programmable conducting polymer 610 is spun on to a Cu bitline 612 that has been exposed to $Cu_2S$ previously illustrated at 614, the layers 610–614 collectively having a thickness of about 300 Å–5000 Å. A top electrode 616 is then deposited unto the polymer 610. A thin film diode layer(s) 618 is then deposited on the top electrode 616. An antireflective coating (ARC) (not shown) can also be deposited thereon to improve the reflectivity of the collective stack. It is noted that although a single stack is illustrated at 600, that subsequent stacks can also be formed thereon—before etching of respective vertical pillars or columns are attempted. Alternatively, the stack 600 can have vertical columns or pillars formed as described below, wherein subsequent stacks are formed and followed by subsequent etchings of vertical pillars or memory structures, and so forth.

At 620, a resist is spun on and exposed at a suitable wavelength. The resist is then developed and the exposed part is removed. At 624, the stack is then etched to remove the ARC (if utilized), TFD 618, top electrode 616, and the programmable polymer 610 in approximately a 3 to 4 stage etch. The etch can be designed so that the resist is moved during the polymer etch. Therefore, no ash process is typically needed. If a thicker resist is needed, then the etch process can be segmented such that the ARC is etched using an $O_2+CHF_3$ etch. The wafer is then resist stripped utilizing a dry etch process. The etch then continues to etch the TFD, top electrode and polymer. The polymer etch can be an $O_2/N_2+CO$ etch and/or $N_2/H_2$ etch, for example.

At 630, a dielectric is then deposited filling between memory cells (between respective pillars) plus the height of a via and word line (greater than sum). The dielectric may be a two-part process including a low deposition rate conformal dielectric followed by a fast deposition dielectric deposition. The deposition can be CVD or spin-on, for example. At 640, the dielectric is planarized to the surface of the TFD 618, wherein a word line 642 is then formed. If desired, the above process can be repeated to produce a plurality of stacked memory cells in accordance with the present invention.

FIGS. 10–14 illustrate alternative materials and processes that may be employed in accordance with an aspect of the present invention. Accordingly, such components that have been previously described such as electrodes, conductive materials, passive layers, organic materials/layers, and processes for fabricating the same will now be described in more detail and in accordance with alternative aspects of the present invention.

Referring to FIG. 10, a 3-D diagram of an organic nmemory device 700 in accordance with an aspect of the present invention is depicted. The memory device includes a first electrode 704, an organic polymer layer 706, a passive layer 708 and a second electrode 710. The diagram also illustrates a voltage source 702 connected to the first electrode 704 and the second electrode 710 that applies a voltage on the first electrode 704 and the second electrode 710. For illustrative purposes, a single first electrode is described. It is to be appreciated however that multiple electrodes having similar properties as the first electrode 704 can be provided in a multi-cell organic memory as previously described above.

The first electrode 704 (or multiple first electrodes) and the second electrode 710 are comprised of a conductive material such as, copper, copper alloy, or silver alloy. Other materials can be aluminum, chromium, germanium, gold, magnesium, manganese, indium, iron, nickel, palladium, platinum, titanium, zinc, alloys thereof, indium-tin oxide, polysilicon, doped amorphous silicon, metal silicides, and the like. Exemplary alloys that can be utilized for the conductive material include copper-silver alloy, copper-zinc alloy. Other materials can be Hastelloy®, Kovar®, Invar, Monel®, Inconel®, brass, stainless steel, magnesium-silver alloy, and various other alloys.

The thickness of the first electrode 704 and the second electrode 710 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 706 and the passive layer 708 are collectively referred to as a selectively conductive media or selectively conductive layer. The conductive properties of this media (e.g., conductive, non-conductive, semi-conductive) can be modified in a controlled manner by applying various voltages across the media via the electrodes 704 and 710.

The organic layer 706 is comprised of a conjugated organic material. If the organic layer is polymer, a polymer backbone of the conjugated organic polymer may extend lengthwise between the electrodes 704 and 710 (e.g., generally substantially perpendicular to the inner, facing surfaces of the electrodes 704 and 710). The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material may be cyclic or acyclic. For some cases, such as organic polymers, the organic material self assembles between the electrodes during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polypyrroles; and the like. Additionally, the properties of the organic material can be modified by doping with a suitable dopant (e.g., salt).

The organic layer 706 has a suitable thickness that depends upon the chosen implementations and/or the memory device being fabricated. Some suitable exemplary ranges of thickness for the organic polymer layer 706 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic layer 706 can be formed via a number of suitable techniques. One suitable technique that can be utilized is a spin-on technique which involves depositing a mixture of the material and a solvent, and then removing the solvent from the substrate/electrode. Another suitable technique is chemical vapor deposition (CVD). CVD, includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. It may have a chemical bond formed between the conjugated organic polymer and the passive layer 708.

The passive layer 708 contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer 706. The particular conductivity facilitating compound employed is selected so that the two relatively stable states match with the two relatively stable states of the conjugated organic molecule of the layer 706.

The passive layer 708 can in some instances act as a catalyst when forming the organic layer 706. In this connection, the backbone of the conjugated organic molecule may initially form adjacent the passive layer 708, and grow or assemble away and substantially perpendicular to the passive layer surface. As a result, the backbones of the conjugated organic molecule may be self-aligned in a direction that traverses the two electrodes.

Examples of conductivity facilitating compounds that may make up the passive layer 708 include one or more of copper sulfide ($Cu_{2-x}S_y$, CuS), copper oxide (CuO, $Cu_2O$), manganese oxide ($MnO_2$), titanium dioxide ($TiO_2$), indium oxide ($I_3O_4$), silver sulfide ($Ag_{2-x}S_2$, AgS), silver-copper-sulfide complex ($Ag_yCu_{2-x}S_2$), gold sulfide ($Au_2S$, AuS), cerium sulfate ($Ce(SO_4)_2$), ammonium persulfate (($NE_4)_2 S_2O_8$), iron oxide ($Fe_3O_4$), lithium complexes ($Li_xTiS_2$, $Li_xTiSe_2$, $Li_xNbSe_3$, $Li_xNb_3Se_3$), palladium hydride ($H_xPd$) (where x and y are selected to produce desired properties), and the like. The passive layer 708 may begrown using oxidation techniques, formed via gas phase reactions, or deposited between the electrodes.

The passive layer 708 has a suitable thickness that can vary based on the implementation and/or memory device being fabricated. Some examples of suitable thicknesses for the passive layer 708 are as follows a thickness of about 2 Å or more and about 0.1 $\mu$m or less, a thickness of about 10 Å or more and about 0.01 $\mu$m or less, and a thickness of about 50 Å or more and about 0.005 $\mu$m or less.

In order to facilitate operation of the organic memory device, the organic layer 706 is generally thicker than the passive layer 708. In one aspect, the thickness of the organic layer is from about 0.1 to about 500 times greater than the thickness of the passive layer. It is appreciated that other suitable ratios can be employed in accordance with the present invention.

The organic memory device, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information . . . ).

During typical device operation, electrons flow from the second electrode 710 through the selectively conductive media to the first electrode 704 based on a voltage applied to the electrodes by the voltage source 702 if the organic layer is n-type conductor. Alternately, holes flow from the first electrode 704 to second electrode 710 if the organic layer 706 is p-type conductor, or both electrons and holes flow in the organic layer if it can be both n and p type with proper energy band match with 708 and 710. As such, current flows from the first electrode 704 to the second electrode 710 via the selectively conductive media.

Switching the organic memory device to a particular state is referred to as programming or writing. Programming is accomplished by applying a particular voltage (e.g., 0.9 volts, 0.2 volts, 0.1 volts, . . . ) across the selectively conductive media via the electrodes 704 and 710. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the organic memory device, the thickness of the various layers, and the like. The voltage supply 702 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state). permits an applied voltage to write, read, or erase information into/from the organic memory cell; whereas the absence of the external stimuli that exceeds a threshold value ("off"state) prevents an applied voltage to write or erase information into/from the organic memory cell.

To read information from the organic memory device, a voltage or electric field (e.g., 1 volts, 0.5 volts, 0.1 volts) is applied via the voltage source 702. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

Figure 11:
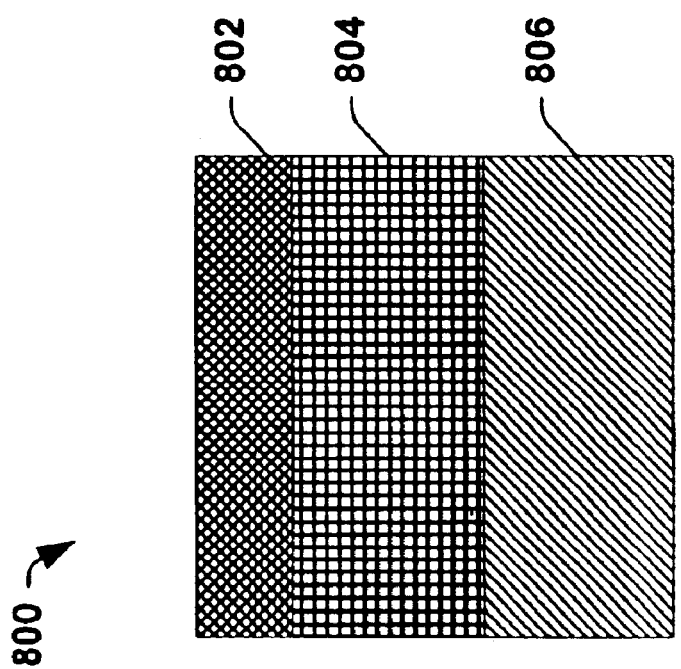
FIG. 11 is a block diagram of a passive layer that can be employed in an organic memory device in accordance with an aspect of the present invention.

FIG. 11 is a block diagram that depicts fabrication of a passive layer 800 in accordance with an aspect of the present invention. A $Cu_{2-x}S_y$ layer is formed by a gas phase reaction operation. A first layer 806 is formed that comprises Cu. A second layer 804 is formed on the first layer. The second layer comprises $Cu_{2-x}S_y$ (e.g., $Cu_{2-x}S_{y2}$, CuS or mixture thereof) and has a thickness of about 20 Å or more. A third layer 802 is formed on the second layer 804. The third layer 802 contains $Cu_2O$, and/or CuO and generally has a thickness of about 10 Å or less. It is appreciated that alternate aspects of the invention can employ suitable variations in composition and thickness and still be in accordance with the present invention.

Figure 12:
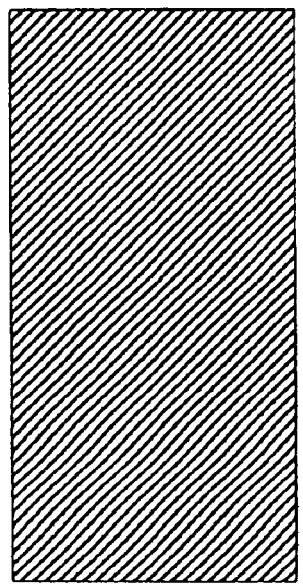
FIG. 12 is a block diagram illustrating an organic polymer layer formed by a CVD process in accordance with an aspect of the present invention.

FIG. 12 is a block diagram illustrating an organic layer 900 formed by a chemical vapor deposition (CVD) process in accordance with an aspect of the present invention. The organic layer 900 is formed via a gas phase reaction process. Typically, the organic layer 900 is formed in contact with a passive layer and an electrode. The organic layer 900 is comprised of polvmer polydiphenylacetylene (DPA). This polymer layer, as shown in FIG. 12, is fabricated to be about 65–75 Å thick.

Figure 14:
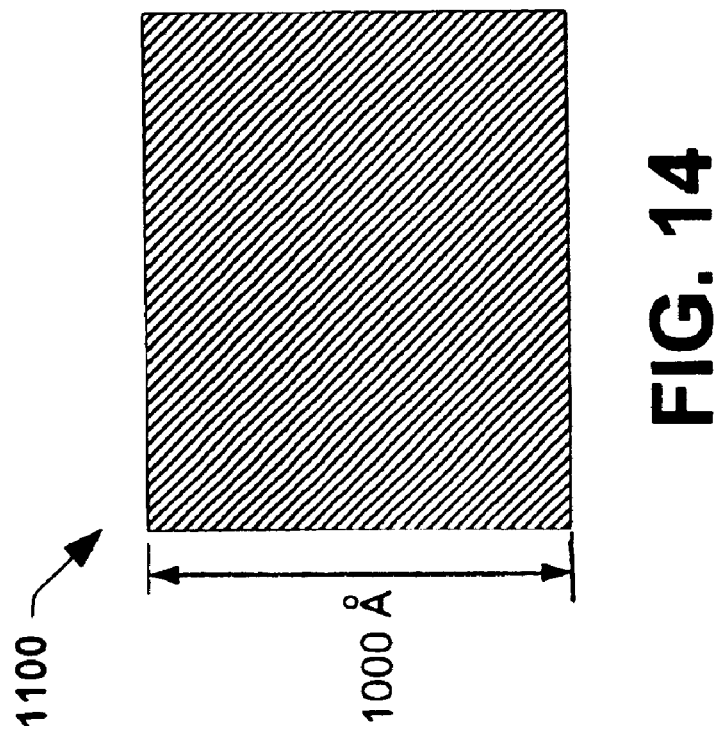
FIG. 14 is a block diagram of yet another organic polymer layer formed by a CVD process in accordance with an aspect of the present invention.
Figure 13:
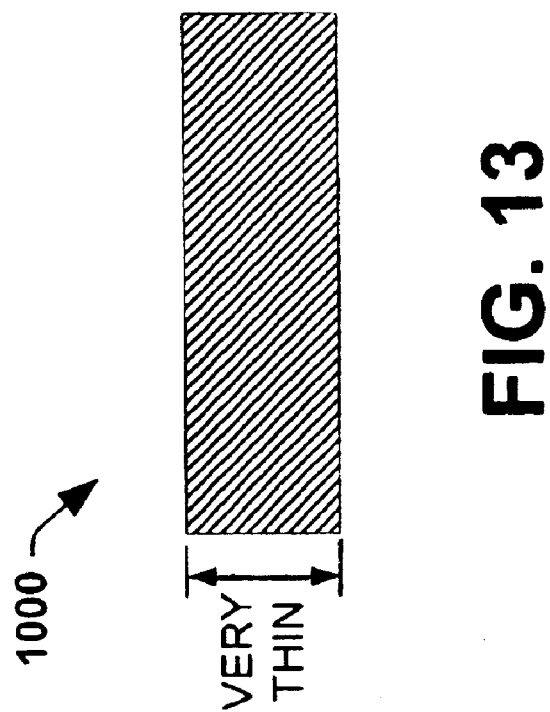
FIG. 13 is a block diagram illustrating another organic polymer layer formed by a CVD process in accordance with an aspect of the present invention.

Turning now to FIG. 13. a block diagram depicting another organic layer 1000 funned from a CVD process in accordance with an aspect of the present invention is illustrated. Once again. the organic layer 1000 is formed via a gas phase reaction process. The organic layer 1000 is formed in contact with a passive layer and an electrode. The organic polymer layer 1000 is comprised of polymer polyphenylacetylene (PPA). Referring to FIG. 14, a block diagram of another organic layer 1100 formed by spin coating in accordance with an aspect of the present invention is illustrated. The organic layer 100 is formed via a spin coating process, instead of a gas phase reaction process. The organic layer 1100 is formed in contact with a passive layer and an electrode. The organic layer 1100 is comprised substantially of PPA and has a thickness of about 1000 Å. It is appreciated that various alternatives to and variations of the layers described in FIGS. 10–14 can be employed in accordance with the present invention.

What have been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to he inclusive in a manner similar to the term "comprising."

What is claimed is:

1. An organic memory device, comprising:
   at least a first organic memory structure and a second organic memory structure arranged in a vertical manner with respect to each other, the at least first and second organic memory structures comprising:
   a first electrode;
   a selectively conductive media formed on the first electrode, the selectively conductive media comprising a passive layer formed on the fist electrode and an organic layer formed on the passive layer; and
   at least one other electrode formed on the organic layer and operative with the first electrode to activate a memory portion in the organic layer; and
   at least one control component to partition the first and second organic memory structures, the at least one control component facilitates acces to at least one of the first organic memory structure and the second organic memory structure.

2. The memory device of claim 1, further comprising one or more vertical columns having at least two organic memory structures per column.

3. The memory device of claim 2, the one or more vertical columns are formed in accordance with a damascene/via process.

4. The memory device of claim 2, the one or more vertical columns are formed in accordance with a stacked pillar process.

5. The memory device of claim 1, the control conmponent further comprises at least one of a diode, a thin-filmed diode (TFD), a zener diode, an LED, a transistor, a thin-filmed transistor (TfT), a Silicon Controlled Rectifier (SCR), Uni Juiction Transistor (UJT), and a Field Effect Transistor (FET).

6. The memory device of claim 3, the TFD is an organic device having a polymer layer formed between a cathode electrode and an anode electrode.

7. The memory device of claim 1, further comprising one or more global access lines to facilitate access to a plurality of organic memory structures.

8. The memory device of claim 1, the organic layer is an organic polymer layer formed on the passive layer.

9. The memory device of claim 8, the passive layer comprising a plurality of individual passive layers.

10. The memory device of claim 8, the passive layer contains $Cu_2S$.

11. The memory device of claim 9, the organic layer being a conjugated organic material.

12. The memory device of claim 8, the organic layer being selected from the group comprising: polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, and polypyrroles.

13. The memory device of claim 8, at least one of the first electrode and the other electrode comprising a material being selected from the group comprising aluminum, chrormium, copper, germanium, gold, magnesium, manganese, indium, iron, nickel, palladium, platinum, silver, titanium, zinc, alloys thereof, indium-tin oxide, polysilicon, doped amorphous silicon, and metal silicides.

14. The memory device of claim 13, further comprising a barrier layer to mitigate diffusion of the electrodes.

15. The memory device of claim 14, the barrier layer further comprismg at least one of cobalt, chromium, nickel, palladium, tantalum, tantalum silicon nitride, titanium, titanium nitride, silicon nitride, tungsten nitride, and tungsten silicon nitride.

16. The memory device of claim 14, the at least one of the first electrode and the other electrode formed in accordance with at least one of a single damascene process and a dual damascene process.

17. The memory device of claim 1, further comprising a plurality of memory cells, repective cells adapted in accordance with claim 2, the plurality of memory cells forming a non-volatile memory device.

18. The memory device of claim 17, further comprising one or more word lines to access the plurality of memory cells.

19. The memory device of claim 17, the non-volatile memory device employed as component in a computer system.

20. An organic memory device, comprising:
    a first memory structure comprising:
        a first electrode;
        a passive layer associated with at least one bit line;
        an organic semiconductor material formed over the passive layer, and
        at second electrode formed over tbe organic semiconductor material to form a memory within the organic semiconductor material;
    at least a second memory structure configured similarly to the first memory structure; and
    at lest one thin-filmed diode separating the first and second memory structures the first memory structure and the second memory structure arranged in at least one column.

21. The organic memory device of claim 20, further comprising a plurality of multi-cell structures packaged as an Integrated Circuit.

22. A method of fabricating an organic memory device, comprising:
    forming a first electrode on a substrate;
    forming a selectively conductive media comprising:
        forming a passive layer on the first electrode;
        forming a dielectric layer over the passive layer;
        forming a via in the dielectric layer,
        filling the via with organic material such that the organic material is in contact with the passive layer;
    forming at least one other electrode on the organic material; and
    forming a switching device over the at least one other electrode to facilitate stacking of organic memory structures.

23. The method of claim 22, further comprising forming a plurality of organic memory structures, respective memory structures separated by a switching device.

24. The method of claim 23, further comprising forminig the plurality of organic memory structures in at least one vertical columnn.

25. The method of claimn 22, further comprising forming the first electrode and the at least one other electrode in accordance with at least one of a single damascene process and a dual damascene process.

26. The method of claim 25, further comprising forming a barrier layer to mitigate diffusion of the first electrode and the at last one other electrode into a subsequent layer.

27. The method of claim 22, further comprising forming at least one word line to access a plurality of memory cells fabricated in accordance with claim 21.

28. The method of clain 22, further comprising filling the via in accordance with a chemical vapor deposition process.

29. The method of claim 22, further comprising filling the via in accordance with a gas phase reaction process.

30. The method of claim 22, further comprising filling the via in accordance with a spin coating process.

31. The memory device of claim 20, the passive layer comprising at least one of copper sulfide, copper oxide, manganese oxide, titanium dioxide, indium oxide, silver sulfide, silver-copper-sulfide complexes, gold sulfide, cerium sulfate, ammonium persulfate, iron oxide, lithium complexes, and palladium hydride.

* * * * *